United States Patent
Tadepalli

(10) Patent No.: US 10,317,456 B2
(45) Date of Patent: Jun. 11, 2019

(54) SPIKE SAFE FLOATING CURRENT AND VOLTAGE SOURCE

(71) Applicant: Texas Instruments Incorporated, Dallas, TX (US)

(72) Inventor: Ramana Tadepalli, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/278,114

(22) Filed: Sep. 28, 2016

(65) Prior Publication Data

US 2017/0276724 A1    Sep. 28, 2017

Related U.S. Application Data

(60) Provisional application No. 62/311,961, filed on Mar. 23, 2016.

(51) Int. Cl.
| | | |
|---|---|---|
| *G01R 19/00* | (2006.01) | |
| *G01R 31/26* | (2014.01) | |
| *G01R 31/28* | (2006.01) | |

(52) U.S. Cl.
CPC ..... *G01R 31/2623* (2013.01); *G01R 31/2837* (2013.01); *G01R 31/2841* (2013.01)

(58) Field of Classification Search
USPC ............ 324/762.01, 762.07, 762.09, 750.07
See application file for complete search history.

(56) References Cited

U.S. PATENT DOCUMENTS

| | | | | | |
|---|---|---|---|---|---|
| 4,851,769 | A | * | 7/1989 | Carpenter ............ | G01R 31/261 324/110 |
| 6,262,670 | B1 | * | 7/2001 | Ballou ............... | G01R 19/0053 324/162 |
| 9,702,924 | B2 | * | 7/2017 | Balakrishnan ..... | G01R 31/2623 |
| 2004/0263256 | A1 | * | 12/2004 | Ishikawa ............ | H01L 27/0629 330/296 |
| 2010/0237838 | A1 | * | 9/2010 | Templeton ............ | H02M 3/157 323/271 |

* cited by examiner

*Primary Examiner* — Vincent Q Nguyen
(74) *Attorney, Agent, or Firm* — Ronald O. Neerings; Charles A. Brill; Frank D. Cimino

(57) ABSTRACT

Spike safe floating current and voltage source (VI) containing a forced voltage amplifier in series with a selectable resistor. A method of providing a VI with forced current testing mode using a forced voltage amplifier in series with a selectable resistor. A method of providing a VI with forced voltage testing mode using a forced voltage amplifier in series with a selectable resistor. A method of measuring the on resistance of a device under test using a VI with a forced voltage amplifier in series with a selectable resistor. A method of measuring the breakdown of an input/output junction of a device under test using a VI with a forced voltage amplifier in series with a selectable resistor.

31 Claims, 4 Drawing Sheets

SPIKE SAFE FLOATING CURRENT AND VOLTAGE SOURCE

CROSS-REFERENCE TO RELATED APPLICATIONS

This application claims the benefit of priority under U.S.C. § 119(e) of U.S. Provisional Application 62/311,961, filed on Mar. 23, 2016, the entirety of which is hereby incorporated herein by reference.

FIELD

The present disclosure is directed, in general, to testing of semiconductor devices and, more specifically, high voltage testing.

BACKGROUND

High power floating voltage and current (VI) sources are used for testing field effect transistors (FETs) or other electronic circuits commonly referred to here as a device under test (DUT). Four quadrant operation of these instruments can be configured in force current (I) mode and in force voltage (V) mode, which includes high current and high precision metering for full spectrum of tests. One operational challenge is to control the amount of energy entering into the DUT in response to the changes of the VI source, which may include over current shutdowns and/or short circuit defects created during a high voltage or high current test. Typically, the DUT being tested can be expected to respond much faster than the VI source. This may result in a high energy influx to the DUT caused by the delay in time between when the DUT behavior changes and when the VI source responds to the change. During this delay, the DUT may temporarily reach range limits before the clamp levels of the VI source can be enforced. A single defective device driven event may damage hardware and circuit boards causing tester down time and costly repairs.

DETAILED DESCRIPTION

Embodiments of the disclosure are described with reference to the attached figures. The figures are not drawn to scale and they are provided merely to illustrate the disclosure. Several aspects of the embodiments are described below with reference to example applications for illustration. It should be understood that numerous specific details, relationships, and methods are set forth to provide an understanding of the disclosure. Well-known structures or operations are not shown in detail to avoid obscuring the disclosure. The embodiments are not limited by the illustrated ordering of acts or events, as some acts may occur in different orders and/or concurrently with other acts or events. Furthermore, not all illustrated acts or events are required to implement a methodology in accordance with the present disclosure.

Figure 1:
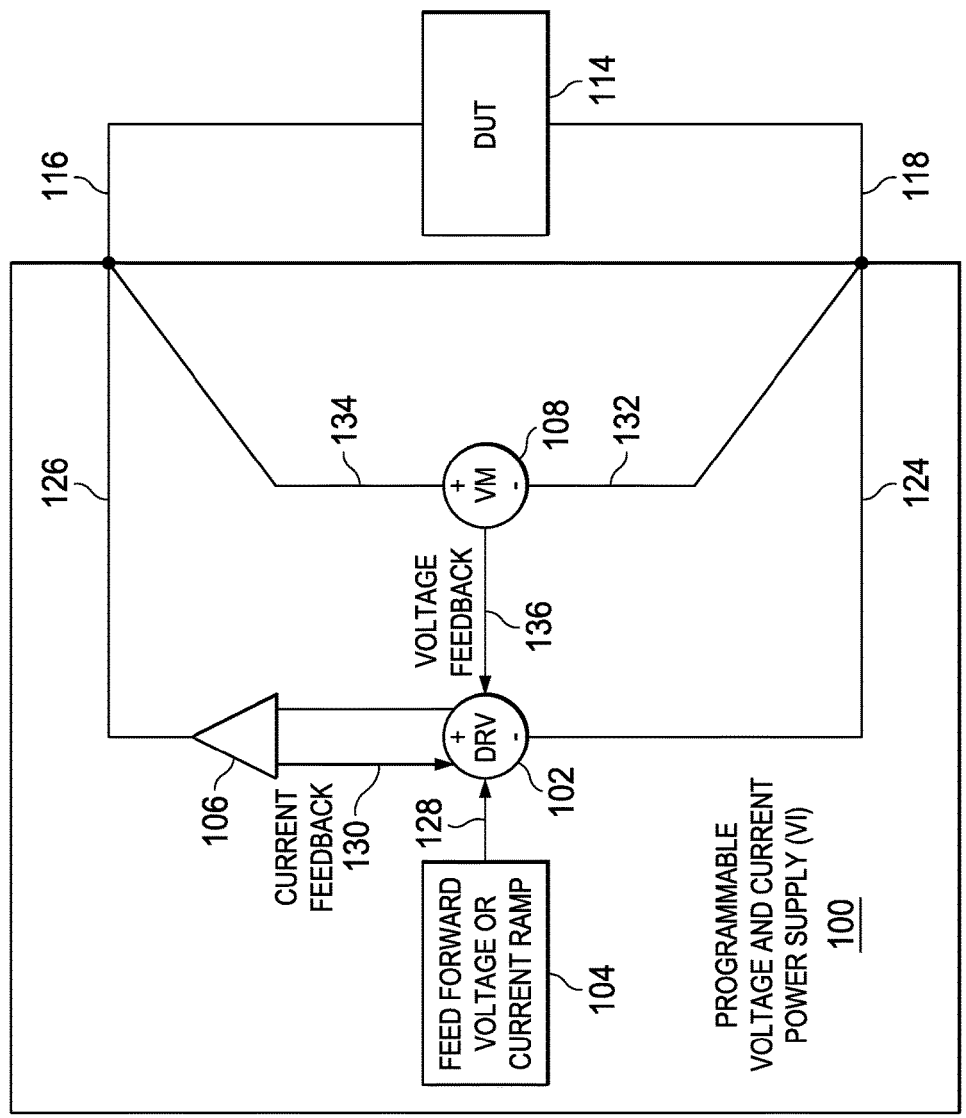
FIG. 1 shows a schematic diagram of a forced current and forced voltage source that uses a forced current amplifier and a forced voltage amplifier.

Several components of an example programmable voltage and current (VI) source 100 are illustrated in FIG. 1. When a forced voltage test is being applied to the DUT 114, the programmable voltage and current driver 102 is used as a programmable voltage source. The driver 102 applies a voltage to the DUT 114. An ammeter 106, which is connected in series with the driver 102 and DUT 114, reads the current. The ammeter 106 then uses a feedback circuit 130 to feed the current value back to the driver 102. A voltmeter 108 is coupled across the sense terminals 116 and 118 of the VI source 100 for measuring the voltage across the DUT 114. The voltmeter 108 uses feedback circuit 136 to feed the voltage value back to the driver 102. In the event the DUT 114 experiences a short circuit during the test, the current may surge to a predetermined capability of the driver 102. The feedback circuit 130 allows a control circuit 104 of the VI source 100 to detect the event, thereby reducing the surge current to a programmed clamp level. This sequence can be performed at the highest voltage at which the VI source 100 may sustain as the DUT 114 is expected to maintain a relatively stable voltage. As a result, a large amount of energy may be driven into the shorted DUT 114.

When a forced current test is being applied to the DUT 114, the programmable voltage and current driver 102 is used as a programmable current source. The driver 102 forces a current through the DUT 114. An ammeter 106 reads the current and uses feedback circuit 130 to feed the current value back to the driver 102. A voltmeter 108 across the sense terminals 116 and 118 of the VI source 100 measures the voltage and uses feedback circuit 136 to feed the voltage value back to the driver 102. In the event the DUT 114 fails at open during the test, the current may spike to the clamping limit before the clamping circuitry in the VI source 100 can turn off the forced current. As such, the delayed response may cause damages to the probe tips, the circuit board, and the DUT 114.

For example, a forced current test may be selected where the DUT 114 is to be tested at 40 V and 50 mA. A current range of 1 A and a voltage range of 50 V may be selected for the VI source 100. A programmed current clamp value of 50 mA may also be selected.

If the DUT 114 fails by shorting, before the clamping circuitry 104 in the VI source 100 can respond and limit the current to 50 mA, the actual current may surge to the range capacity of 1 A. A surge in current of this magnitude even for a small duration can burn the probe tips, destroy the DUT 114 and destroy other components on the printed circuit board (PCB).

Figure 2:
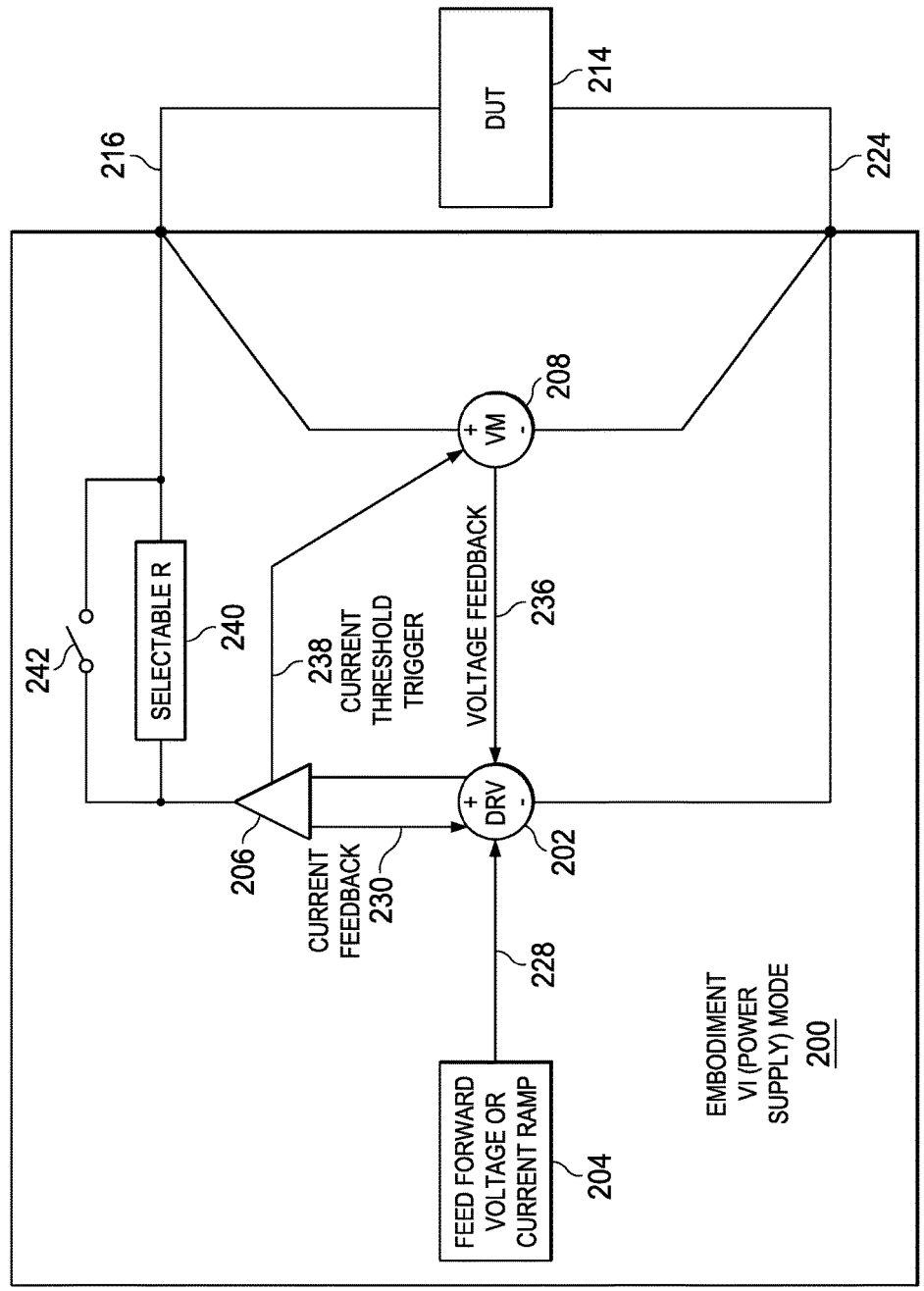
FIG. 2 shows a schematic diagram of a floating current VI source.

Referring to FIG. 2, a spike-safe floating current and voltage (VI) source 200 can be used to prevent large amount of energy transfer during a current surge.

A selectable resistor 240 may be added in series between a forcing voltage amplifier (VAMP) 202 and the sense terminals 216 and 224 of the VI source 200. The selectable resistor 240 serves as a means to provide a surge current response faster than the programmable clamping of the VI source 200.

The VI source 200 avoids high energy transient situations during current testing. If the DUT 214 fails by shorting, the maximum current is limited to an amount that is equal to the forced voltage of the VAMP 202 divided by the resistance of the selectable resistor 240. If the DUT 214 fails by forming an open circuit, the current will quickly drops to a significantly low value because the forced voltage remains constant while the resistance associated with the terminal 216 may substantially increases.

The selectable resistor 240 may have a wide range of resistance since the accuracy of the current and voltage measurements are independent of the value of the selectable resistor 240. To enable the testing of the DUT 214 with varied current specifications, an array of parallel resistors may be selectively connected to the terminal 216. When all the switches 242 are closed, none of the selectable resistors 240 is selected.

Appropriate DUT board connection terminals may be provided on the VI source 200 so that an external selectable resistor and relays may be added on the DUT board instead of including the selectable resistor to achieve the same electrical configuration.

Significant operational efficiency improvements and thus cost savings are realized with the embodiment VI source 200. Advantageously, probe tip replacement is reduced and circuit board down time and repair is reduced.

Figure 3:
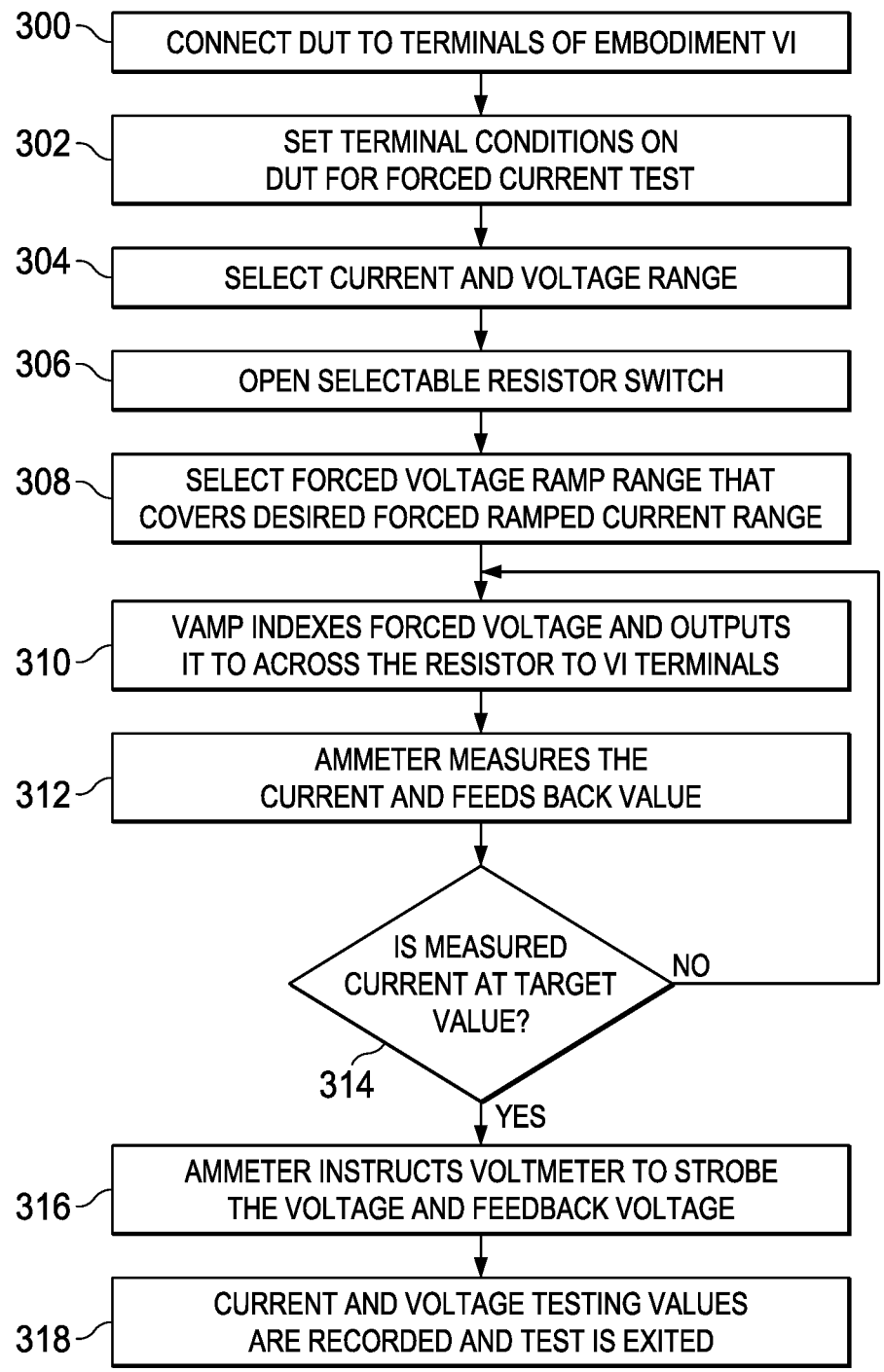
FIG. 3 shows a flow diagram of the operation of a clamped floating current and voltage source during a ramped current test.

The operation of the VI source 200 during a forced current test is described in a flow diagram in FIG. 3. For illustration a current ramp test from 0.1 A to 0.65 A is performed on the DUT 214.

In step 300, the DUT 214 is connected to the terminals 216 and 224 of the VI source 200.

In step 302, the terminal conditions on the DUT 214 are set for the forced current test to be performed. For illustration the DUT 214 is tested with a current ramped from 0.1 A to 0.65 A.

In step 304, the current range (e.g., 1 A) and the voltage range (e.g., 10 volts) are selected for the forced current test. A clamp voltage (e.g., 6.5 volts) and a clamp current (e.g., 0.65 A) may also be selected.

In step 306, the bypass switch 242 is opened for selecting a certain amount of resistance from the selectable resistor 240. For example, a 10 ohm resistance can be selected.

In step 308, the forced voltage ramp is selected, such that it can produce a current having a predetermined forced current range to flow through the selectable resistor 240. In this example, the voltage is ramped from 1 V to 6.5 V to generate a current ramp from 0.1 A to 0.65 A through a 10Ω resistor.

In step 310, the VAMP 202 outputs a first forced voltage (1 volt) that generates a current of 0.1 A through the 10 ohm resistor 240 and through the DUT 214.

In step 312, the ammeter 206 measures the current and feedbacks the current value to the VAMP 202 using the current value feedback circuit 230.

In step 314, if the measured current is below the target current testing value the test returns to step 310 where the VAMP 202 adjusts the forced voltage to a higher value resulting in increased current in the selectable resistor 240 and the DUT 214

In step 314, if the current is on target, the test proceeds to step 316 where the ammeter 206 communicates with the voltmeter 208 using communication circuit 238 and instructs the voltmeter 208 to measure the voltage. After the voltage measurement, the voltmeter 208 feedbacks the measured voltage value to the VAMP 202 using the feedback circuit 236.

In step 318, the current and voltage testing values are recorded and the test is terminated.

In this example, if a defective DUT 214 fails open, the current drops to 0 as discussed previously. As such, the VI source 200 prevents damages to the DUT 214, the probe pins, and the PCB.

In this example, if a defective DUT 214 fails by shorting, the selectable resistor 240 restricts the current influx to the DUT 214. To that end, the IV source 200 prevents damage to the probe pins or the PCB. In this illustrative example the current can be set to a ceiling of about 0.65 A by the selectable 10Ω resistor 240.

Figure 4:
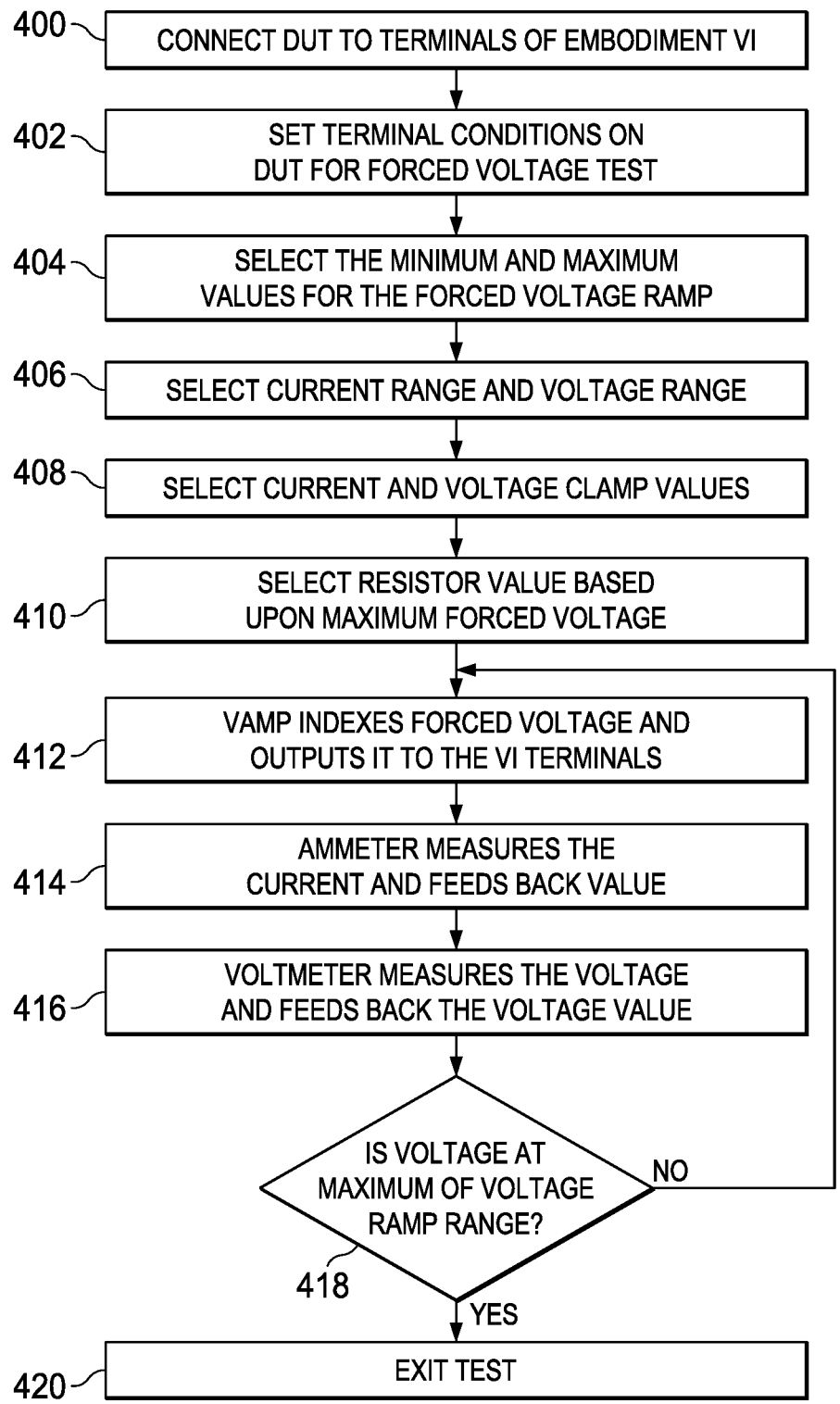
FIG. 4 shows a flow diagram of the operation of a clamped floating current and voltage source during a ramped voltage test.

The operation of the VI source 200 during a forced voltage test is described in a flow diagram in FIG. 4.

In step 400, the terminals of the DUT 214 to be tested are connected to the sense terminals 216 and 224 of the embodiment VI source 200.

In step 402, the terminal conditions on the DUT 214 are set for the voltage test to be performed.

In step 404, the minimum and maximum force voltage values for the voltage ramp test are selected.

In step 406, the current and voltage ranges that are compatible with the forced voltage ramp test are selected.

In step 408, the current and voltage clamp values are selected.

In step 410, a selectable resistor value is chosen based upon the maximum testing voltage so that the VI source 200 and the DUT 214 may be protected in the event of a shorting failure.

In step 412 the VAMP 202, outputs a forced voltage to the low and high sense terminals of the VI source 200 and to the DUT 214.

In step 414, the ammeter 206 measures the current and sends the value to the VAMP 202 using the current value feedback circuit 230.

In step 416, the voltmeter 208 measures the voltage across the sense terminals of the VI source 200 and communicates the value to the VAMP 202 using a voltage value feedback circuit 236.

In step 418, if the measured voltage is below the maximum target voltage testing value, the test returns to step 412 where VAMP 202 adjusts the forced voltage to a higher value.

Steps 412 through 418 are repeated until the maximum target voltage testing value is reached. When the maximum target voltage testing value is reached the test proceeds from step 418 to step 420, at which point the test is terminated.

The on resistance (RDSOn) of a DUT 214 is typically measured by forcing a current through an on DUT 214 and measuring the resultant voltage across the sense terminals, 216 and 224. The RDSOn is then calculated by dividing the measured voltage by the measured current.

The voltmeter 208 of the embodiment VI source 200 may be ranged independently so that the voltage measurement is an accurate measurement of the voltage across the terminals, 216 and 224, of the DUT 214. This results in an accurate RDSOn value.

A voltage pulse train with an increasing pulse height may be applied to the I/O junction of the DUT 214 and allowed to settle at the junction breakdown voltage (BVDSS) value. The voltmeter 208 may be strobed to accurately measure the junction voltage when it plateaus (BVDSS) and no longer increases as the pulse height increases. A larger voltage overhead may be needed on the embodiment VI source 200 for this measurement, but the presence of the selectable resistor 240 limits the current and avoids a high power event.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A test device, comprising:
 a first terminal and a second terminal;
 a voltage driver coupling the first terminal to the second terminal;
 an array of selectable resistors coupled between the voltage driver and the first terminal; and
 a switch coupled between the voltage driver and the first terminal in parallel with the array of selectable resistors.

2. The test device of claim 1, wherein the switch is configured to open during a current testing mode.

3. The test device of claim 1, wherein the switch is configured to close during a voltage testing mode.

4. The test device of claim 1, further comprising:
 an ammeter coupled between the voltage driver and the array of selectable resistors; and
 a feedback circuit coupled between the ammeter and the voltage driver.

5. The test device of claim 4, further comprising:
 a voltmeter coupled between the first and second terminals;
 a second feedback circuit coupled between the voltmeter and the voltage driver; and
 a current threshold trigger circuit coupled between the ammeter and the voltmeter.

6. A method of testing a device, comprising:
 connecting a device under test (DUT) to a voltage driver;
 using a bypass switch to select a resistance from an array of parallel resistances coupled between the voltage driver and the DUT;
 applying a voltage from the voltage driver, through the selected resistance, and to the DUT; and
 measuring a current from the voltage driver.

7. The method of claim 6, wherein the voltage driver is a programmable voltage driver.

8. The method of claim 6, wherein the voltage driver is a voltage driver and current driver.

9. The method of claim 6, wherein the voltage driver is a programmable voltage driver and current driver.

10. The method of claim 9, wherein a control circuit coupled to the voltage driver is enabled to detect a surge current at a determined clamp level.

11. The method of claim 9, wherein a control circuit coupled to the voltage driver and current driver is enabled to detect a surge current at a determined clamp level.

12. The method of claim 6, wherein a control circuit coupled to the voltage driver is enabled to detect a surge current at a determined clamp level.

13. The method of claim 12, wherein the selectable resistor serves as a means to provide a surge current response faster than clamping of the voltage driver.

14. The method of claim 12, wherein the selectable resistor serves as a means to provide a surge current response faster than clamping of the voltage driver and current driver.

15. The method of claim 6, wherein the bypass switch comprises multiple switches wherein when all the switches are closed, none of the parallel resistors are selected.

16. A method of testing a device, comprising:
 connecting a device under test (DUT) to a voltage driver;
 using a bypass switch to select a resistance from an array of parallel resistors coupled between the voltage driver and the DUT, the resistance associated with a target test voltage;
 applying a voltage from the voltage driver, through the selected resistance, and to the DUT; and
 measuring voltage across the DUT.

17. The method of claim 16, wherein the voltage driver is a programmable voltage driver.

18. The method of claim 16, wherein the voltage driver is a voltage driver and current driver.

19. The method of claim 16, wherein the voltage driver is a programmable voltage driver and current driver.

20. The method of claim 19, wherein a control circuit coupled to the voltage driver is enabled to detect a surge current at a determined clamp level.

21. The method of claim 19, wherein a control circuit coupled to the voltage driver and current driver is enabled to detect a surge current at a determined clamp level.

22. The method of claim 16, wherein a control circuit coupled to the voltage driver is enabled to detect a surge current at a determined clamp level.

23. The method of claim 22, wherein the selectable resistor serves as a means to provide a surge current response faster than clamping of the voltage driver.

24. The method of claim 22, wherein the selectable resistor serves as a means to provide a surge current response faster than clamping of the voltage driver and current driver.

25. The method of claim 16, wherein the bypass switch comprises multiple switches wherein when all the switches are closed, none of the parallel resistors are selected.

26. A method of measuring a resistance of a device, comprising:
 connecting the device to a first terminal and a second terminal of a tester;
 applying a voltage to the device via a resistance selected from an array of parallel resistors;
 measuring a current through the selected resistance;
 measuring a voltage across the first and second terminals; and
 calculating the resistance by dividing the measured voltage by the measured current.

27. The method of claim 26, wherein the applying a voltage to the device includes:
 applying a first voltage to the device for calculating a first resistance value; and
 applying a second voltage to the device for calculating a second resistance value.

28. A method of measuring a drain breakdown voltage (BVDSS) of a device, comprising:
 connecting input-output (I/O) junctions of the device to a first terminal and a second terminal of a tester;
 selecting a resistor from an array of parallel resistors coupled between the first terminal and a voltage driver applying a series of voltage pulses;
 applying a voltage pulse train with an increasing pulse height to the I/O junctions of the device;
 measuring a voltage across the first and second terminals; and
 determining the BVDSS as a maximum measured voltage.

29. The method of claim 28, wherein the BVDSS is less than a maximum pulse height.

30. The method of claim 28, wherein the voltage pulse train with an increasing pulse height is applied to the I/O junction of the DUT and allowed to settle at the junction breakdown voltage (BVDSS) value.

31. The method of claim 28, wherein a voltmeter measures the voltage and is strobed to accurately measure the junction voltage when it plateaus (BVDSS) and no longer increases as the pulse height increases.

\* \* \* \* \*